United States Patent
Camien et al.

[19]

[11] Patent Number: 6,072,234
[45] Date of Patent: Jun. 6, 2000

[54] STACK OF EQUAL LAYER NEO-CHIPS CONTAINING ENCAPSULATED IC CHIPS OF DIFFERENT SIZES

[75] Inventors: Andrew N. Camien, Costa Mesa; James S. Yamaguchi, Laguna Niguel, both of Calif.

[73] Assignee: Irvine Sensors Corporation, Costa Mesa, Calif.

[21] Appl. No.: 09/316,740

[22] Filed: May 21, 1999

Related U.S. Application Data

[62] Division of application No. 08/777,747, Dec. 21, 1996, Pat. No. 5,953,588.

[51] Int. Cl.⁷ .................................................. H01L 23/02
[52] U.S. Cl. ...................... 257/686; 257/724; 257/777
[58] Field of Search ........................ 438/106, 107, 438/109, 110, 112, 113; 257/686, 777, 787, 685, 724

[56] References Cited

U.S. PATENT DOCUMENTS

| | | | |
|---|---|---|---|
| 4,980,002 | 12/1990 | Dzarnoski, Jr. et al. | 257/724 |
| 5,455,455 | 10/1995 | Badehi . | |
| 5,561,622 | 10/1996 | Bertin et al. | 257/686 |
| 5,625,221 | 4/1997 | Kim et al. | 257/686 |
| 5,702,984 | 12/1997 | Bertin et al. | 257/686 |
| 5,776,800 | 7/1998 | Hamburgen et al. . | |
| 5,953,588 | 9/1999 | Camien et al. | 438/106 |

OTHER PUBLICATIONS

EPIC CSP Assembly and Reliability Methods, by James E. Kohl et al., pp. 129–133, May 6–8, 1998.

*Primary Examiner*—Kevin M. Picardat
*Attorney, Agent, or Firm*—Myers, Dawes & Andras

[57] ABSTRACT

Neo-chips suitable for stacking in 3D multi-layer electronic modules are formed by embedding (encapsulating) IC chips in epoxy material which provides sufficient layer rigidity after curing. The encapsulated chips are formed by placing separate IC chips, usually "known good" die, in a neo-wafer, which is subjected to certain process steps, and then diced to form neo-chips. The following benefits are obtained: (1) The starting IC chips (die) intended for stacking may have different sizes, and serve different electronic purposes. After they are encapsulated in same-size neo-chips, they can be efficiently stacked using well-developed processing steps; (2) The individual chips for stacking can be purchased as "known good" die. This means than an essentially unlimited choice of die is available to the stacking entity, and that the die are pretested when they are ready for stacking; (3) A given layer can contain a plurality of individual die; and (4) The die encapsulating material is dielectric, so that no special steps are required to prepare the access plane of the stack for metalization. Heretofore, this preparation of the access plane has required either the etch-back plus passivation process, or the passivation plus trench-formation process.

33 Claims, 7 Drawing Sheets

STACK OF EQUAL LAYER NEO-CHIPS CONTAINING ENCAPSULATED IC CHIPS OF DIFFERENT SIZES

RELATED APPLICATION

This is a divisional application of parent application Ser. No. 08/777,747, now U.S. Pat. No. 5,953,588.

BACKGROUND OF THE INVENTION

This invention relates to the dense packaging of electronic circuitry, and specifically to the stacking of integrated circuit (IC) chips, or die.

A publication titled "Three-Dimensional Electronics Packaging" was issued in November, 1993 by Tech Search International. It describes the 3-D packaging techniques offered by over thirty manufacturers. It includes a table comparing 23 types of packaging in terms of density, manufacturability, flexibility and affordability. The publication also refers to four types of 3-D stacking techniques, one of which is "bare die stacking". It then divides "bare die assembly into standard ICS" and "custom ICs".

The assignee of this application, Irvine Sensors Corporation, has been a leader in developing high density packaging of IC chips, originally for use in focal plane modules, and then for use in a variety of computer functions, such as memory. In the publication cited in the preceding paragraph, Irvine Sensors is listed as a developer of "bare die assemblies" using "custom ICs".

Generally, stacking of IC chips has emphasized use of identical-area chips, each of which performs the same function. The resulting stack is a rectangular parallelepiped (or cube) having substantially planar outer surfaces. One or more of the outer surfaces is an access plane, reached by electrical leads from the IC circuitry of the stacked chips, in order to permit connection to external circuitry.

An early effort to provide a 3-D electronics stack combining different functions, different area electronic chips is illustrated by Kravitz et al., U.S. Pat. No. 3,370,203. That patent shows stacked "frames" having dimensions "such that integrated circuits which have slightly different dimensions can be mounted thereon", explaining that "integrated circuits from different sources of supply are often advantageously incorporated in a single module".

SUMMARY OF THE INVENTION

The present invention provides stackable IC chip, or die, layers which permit chips having different functions and therefore different areas to be stacked as if they were same size chips, using stacking and electrical connection techniques and tools which have been developed for same size chips. The new units may be referred to as "neo" (or "pseudo" or "virtual") chips. The process involves the "potting" of individual chips in a compound which supports and insulates each chip, and which can be cut, or diced, to provide equal area layers, so that chips having different sizes can be stacked in layers whose edges are flush with one another.

In addition to the advantage of being able to use chips of varying sizes in a given stack, the present invention permits the processing and stacking of chips purchased as individual die, which are more readily available than chips purchased in wafer form. Furthermore, the chips purchased as individual die are generally "known good" die, which have been "burned in", and are therefore pre-tested prior to stacking.

The individual chips, in die form, are incorporated into neo-wafer form for processing. Thereafter, layers are cut out of the neo-wafer and incorporated into stacks.

Each layer of a completed stack has electrical leads which connect the IC circuitry of the embedded chip (or chips) to one or more access planes, where the electrical leads are available for connection to exterior circuitry.

The potting compound in which the chips are embedded needs to be dielectric, assuming semiconductor chips are used, and also needs to have sufficient strength and thermal stability to maintain the shape of each layer as it is laminated into a stack. The potting compound may incorporate embedded strengthening members and it may incorporate embedded heat-conducting elements, if necessary.

Generally, the potting compound will engage each chip on all of its surfaces except its active (top) surface, i.e., the surface adjacent to the IC circuitry contained in the chip. That surface preferably will be covered by another type of dielectric, which lies between the active chip surface and the electrical leads which connect to exterior circuitry. The potting compound may also be removed from the bottom surface if the chip-containing layer is thinned.

As stated above, the chips which are embedded in the supporting material to form layers having the desired area, are preferably purchased from suppliers as "known good" die, which have been diced from wafers and tested.

Since the potting compound provides an access plane edge which is insulated, it is not necessary to use either the "etch-back" technique or the "trench via" technique for lead accessibility, processes previously developed by the assignee of this application.

Prior to stacking, one or more known good die are used to create a "neo" wafer, by locating those known good die in a potting fixture. Potting material is flowed into the fixture, which is enclosed; and then the potting material is cured. The resulting "neo-wafer" is removed from the fixture, and then subjected to pre-stacking process steps, including spinning on a layer of dielectric material, forming vias through that material to reach the terminals on the die in the wafer, and then forming on top of the dielectric layer electrical conductors leading from the die terminals. Thereafter the neo-wafer is diced into one or more layers suitable for stacking, each layer containing at least one of the known good die.

Major cost-saving benefits can be obtained by (a) the use solely of "known good" die, and (b) the use of a neo-wafer in processing one or more such die.

DETAILED DESCRIPTION OF SPECIFIC EMBODIMENTS

Figure 1:
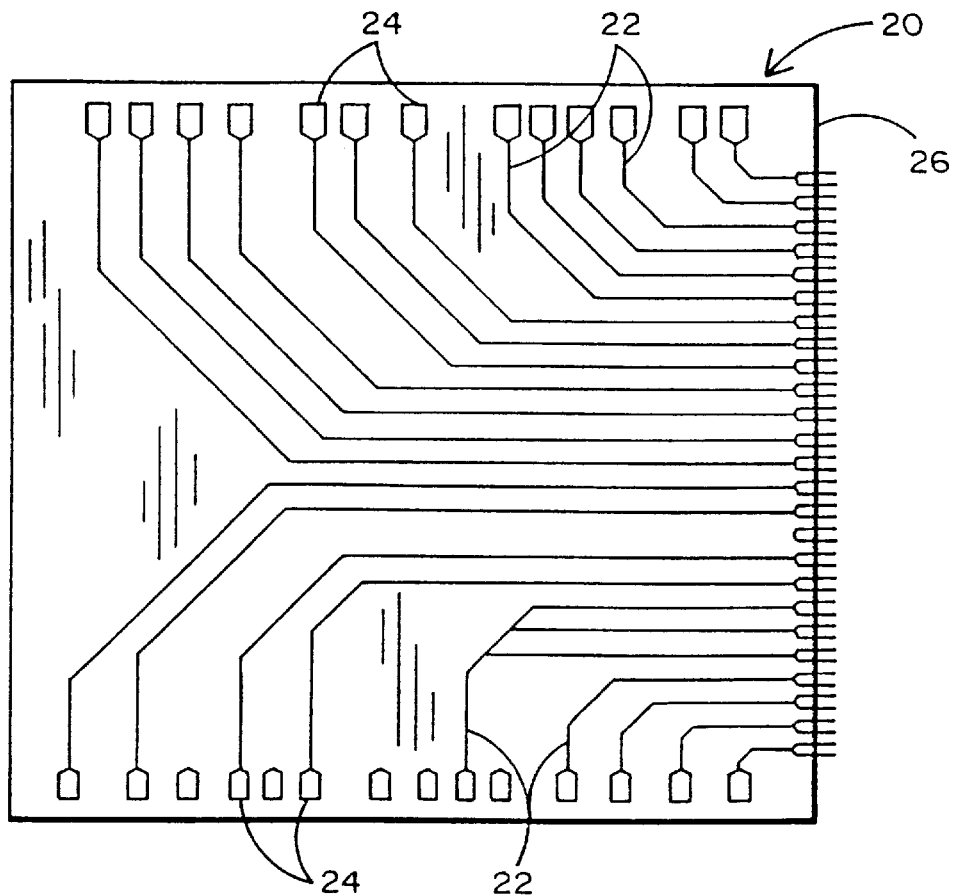
FIG. 1 is a plan view of an IC chip.

FIG. 1 shows a typical flash memory IC chip 20 designed for incorporation into a stack of identical chips. The upper surface of chip 20 has numerous electrical leads 22, each of which connect an original die bonding pad 24 to one edge 26 of the IC chip. Generally, rerouting of the leads is required to bring them all to the same edge 26, which will be part of the access plane in the stacked module. In some cases, the original chip cut from the wafer does not require lead rerouting, i.e., if the wafer was dedicated to providing chips specifically prepared for subsequent stacking. In some instances, the leads 22 may be routed to more than one edge of the IC chip 20.

After a plurality of die are diced (cut) from a wafer supplying identical die, they may be stacked and secured together to provide a dense electronic package. Then the edge 26 of each stacked die will have its leads connected to circuitry at the access plane of the stack, available for connection to external circuitry.

Many types of chips have been used to form stacks: memory chips (DRAM, SRAM, FLASH), and other function chips, such as FPGAs (field programmable gate arrays). In almost all prior cases, the chips in a given stack have been same function, same size chips.

A major problem is confronted when it is desired to combine in a single stack chips of different sizes, which provide different functions, such as memory chips combined in a stack with one or more microprocessor chips.

Figure 2:
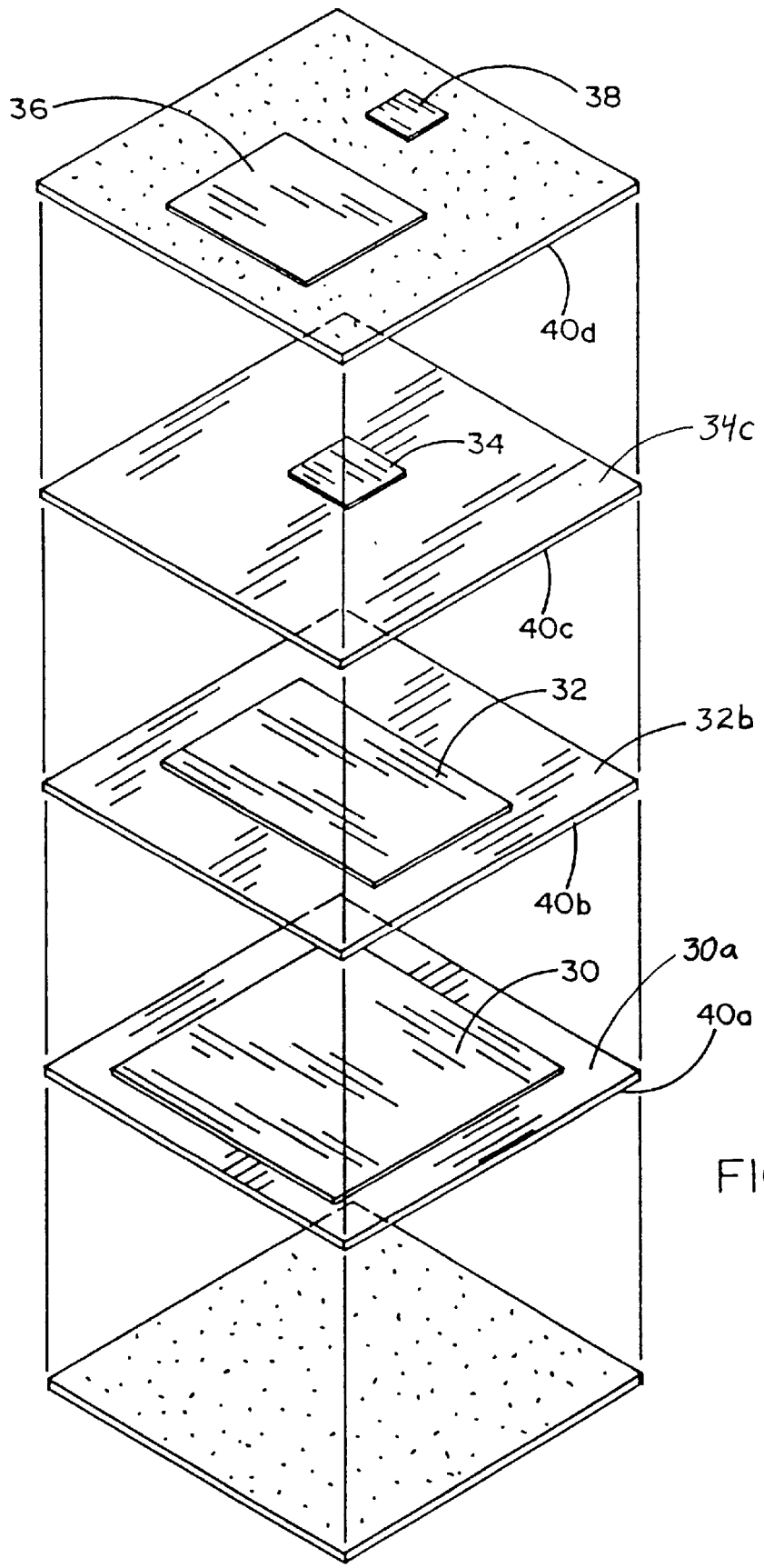
FIG. 2 is an isometric, exploded view illustrating a plurality of stackable layers having IC chips of different sizes.

An example of a single stack combining several different chip sizes is shown in FIG. 2, in an exploded view. The purpose of the FIG. 2 stack is to build a camera in a cube. A visible imaging array forms an image. The array is controlled by an FPGA. The data is converted to digital by an ADC and stored in a FLASH memory for later recall. Each die in the stack has a different size from the other die.

In FIG. 2, a FLASH memory chip 30 is to be combined with an FPGA chip 32, an ADC (analog to digital converter) chip 34, an APS (active pixel sensor) chip 36, and an Op Amp (operational amplifier) chip 38. The dimensions of each chip shown in FIG. 2 vary from the FLASH memory chip 30, which is the largest, to the much smaller ADC chip 34 and op amp chip 38.

In order to handle the layers during stacking, utilizing the most desirable tooling and processing concepts, it is necessary to have equal size layers 40. In FIG. 2, the four equal size layers are individually identified by numerals 40a, 40b, and 40c and 40d. The solution of the problem with respect to layers 40a, 40b, and 40c is obtained by encapsulating chips of various sizes in separate layers of material. Layers 40a, 40b, and 40c all have the same layer area even though each layer has a die with a different die area. Each layer also has an encapsulating area defined by the encapsulating material. Mathematically, the encapsulating area would be defined by the layer area minus the die area for each layer. Therefore, in order for layer 40a, which has a die 30 with a large die area, to have the same layer area as layer 40c, which has a die 34 with a smaller die area, the encapsulating material 30a of layer 40a must have a smaller encapsulating area than the encapsulating area of the encapsulating material 34c of layer 40c. Similarly, layer 40b has the same layer area as layers 40a and 40c, but a die 32 with a different die area than the die areas of dies 34 and 30. Thus, the encapsulating material 32b of layer 40b will also have a different area than the encapsulating layers 34c and 30a of layers 40c and 40a. Layer 40d is shown as a ceramic cap chip, on top of which chips 36 and 38 are mounted. As stated above, the encapsulating material of layers 40a, 40b and 40c must provide, when hardened, sufficient rigidity to avoid flexibility of the individual layers during subsequent stacking steps. Also, the material should be non-conducting electrically, i.e., dielectric, so that the encapsulated chips will be insulated from one another and from the metallic leads associated with the stacked layers.

The encapsulating, or potting, material needs to be handled in fluid form while it fills a potting fixture, or mold, in which one or more die are retained. A single fixture may contain one die or many die. In the latter case, very precise die location is required. After the fluid material has been inserted into the fixture, the fixture is closed, and the encapsulating material is caused to harden (i.e., is cured) by applying heat.

As a result of testing thus far performed, the preferred potting material is an epoxy designated as Epotek 377. This material is desirable as the wafer, or handle, material which encapsulates the die, but it is not desirable as a layer of passivation on the top, or active surface of the die.

Although this encapsulating process can be performed with a single die in the fixture, it is highly desirable to have a substantial number of die in the fixture, so that the resulting neo-wafer will permit substantial cost-savings. Using a multiple die neo-wafer permits manufacturing economies in subsequent process steps, which can be performed simultaneously on a substantial number of pre-dicing layers being prepared for stacking.

Figure 3:
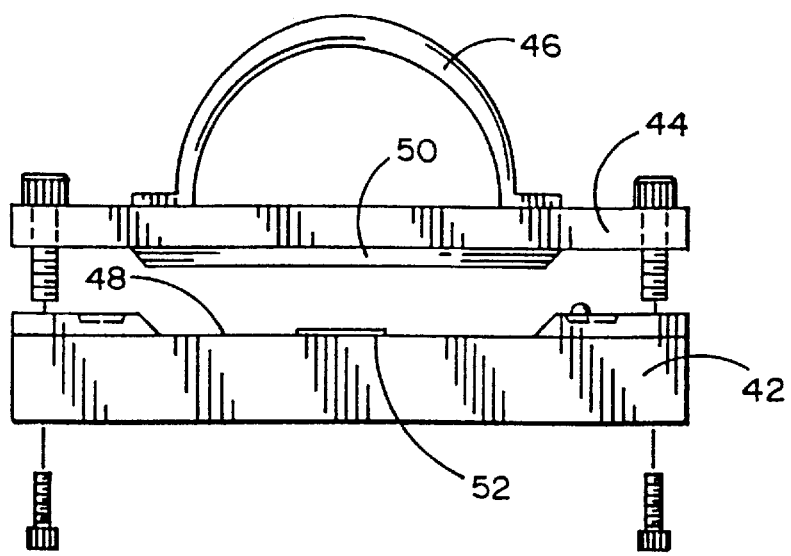
FIG. 3 is a side view of a potting fixture, or container.

FIG. 3 shows a two-part potting fixture, or tool, comprising a lower portion 42 and an upper portion 44 having a handle 46. A recess 48 formed in lower portion 42 receives an aligned raised surface, or boss, 50, formed in upper portion 44, so that boss 50 cooperates with recess 48 to confine the potting material during the wafer formation. The structure of the potting fixture may be varied as experience dictates.

In FIG. 3, a single die 52 is shown in the center of recess 48. It is an IC chip which is preferably a pretested known good die. There is a seeming anomaly in the "re-wafering" of one or more IC chips. The chip or chips used in the present process have been previously manufactured from a silicon wafer, which has been processed to provide numerous units, each of which incorporates integrated circuitry connected to suitable pads formed on the upper surface of the wafer. After the wafer has been processed, numerous individual die, or chips, are formed by dicing the wafer along streets between separate die. For use in stacking, the "re-wafering" is desirable, perhaps necessary, to make it possible to perform the necessary pre-stacking processing steps, which would be difficult or impossible to perform by handling a single chip.

The process of re-wafering one or more chips 52 includes the following steps:

1. Place drop of epoxy on bottom plate of potting tool.
2. Place silicon die face-down onto epoxy drop without pressing.
3. Place fixture in vacuum chamber, and evacuate.
4. Apply potting epoxy by pouring over back of die (while in vacuum).
5. Remove from vacuum chamber and carefully apply and secure top portion of potting tool.
6. Place tool in oven, and cure the epoxy.
7. Remove from oven and allow to air cool (this minimizes epoxy warpage)
8. Remove epoxy/silicon wafer from tool.
9. Remove any epoxy from circuit side of die.

The die 52 is preferably placed faced down on the lower portion 42 of the potting tool. It is desired to have the potting material cover the bottom and sides of the die, but not the top of the die. The top is designated as the surface near to the integrated circuitry, the surface on which the electrical terminal pads are formed. One reason for placing the die face down is to maintain its active surface as flat as possible. Subsequently the top (active) surface of the die will be covered by a dielectric layer formed of material different from the potting material.

The dielectric layer on top of the die preferably is formed from a more compliant material than the encapsulating epoxy, and is less likely to be damaged by expansion than the potting material. The presently preferred material for the passivation layer on top of the die is a polymer designated as BCB (Benzocyclobutene). It planarizes (maintains a flat surface) better than other materials, and has several other advantages as a dielectric layer between adjacent IC chips in a stack. Other commonly used dielectric materials for use between chips have been polyimides.

Because the epoxy potting compound is not desired on the active surface of the die, the potting process is intended to keep that surface as free from the epoxy as possible, although a drop of epoxy is used to hold the die 52 in place on the lower portion 42 of the potting tool.

In the listed steps 1 through 4, it is important to prevent creation of air bubbles in the epoxy. If this could be accomplished while keeping the active surface epoxy-free, step 9 could be eliminated.

Once the re-wafering has been completed, and the wafer removed from the potting tool, the wafer will be held with the active face of the die up, and the necessary processing steps will be formed on that surface, including spinning the dielectric material on the wafer, photo-patterning to define vias through the dielectric to the die terminals, sputtering metalization on top of the dielectric, and photo-patterning to define electrical circuitry leading from the die terminals to an edge of the desired layer. These wafer surface steps are the same whether the wafer contains one die or many die.

The wafer surface process steps may be summarized by adding the following steps to those listed above.

10. Apply passivation layer to circuit face of wafer.
11. Etch or photodefine vias in passivation layer.
12. Apply field metal to wafer as prelude to plating.
13. Apply and image photoresist.
14. Metalize (plate up) wafer.
15. Remove photoresist.
16. Remove excess field metal.
17. Apply top layer of passivation to protect modification metal.

Applying a passivation layer to the surface of the wafer may be accomplished by depositing a measured amount of material, e.g., BCB, on the wafer, and then spinning to spread the material evenly over the wafer surface. One reason a wafer is needed for the pre-stacking steps is that both spin-on of the dielectric, and subsequent spin-on of photo-resist material, cause "bead" formation at the edge. Such beads, if not removed, would interfere with subsequent lithography by causing separation between the chip surface and the photo mask. Using a wafer permits wiping the bead material off the wafer without contacting the encapsulated die.

Additionally, re-wafering is needed because a single die, obtained from a supplier, would be too small for convenient handling.

Subsequently, vias reaching down to the pads on the die are etched or photodefined in the passivation layer, then the wafer surface is metalized to provide leads from the pads to an edge of the layer which encapsulates the die. After applying a protective layer of passivation on top of the metalization, the wafer is diced to create a neo-chip layer having the desired dimensions for inclusion in a 3D stack (see FIG. 2).

Figure 4A:
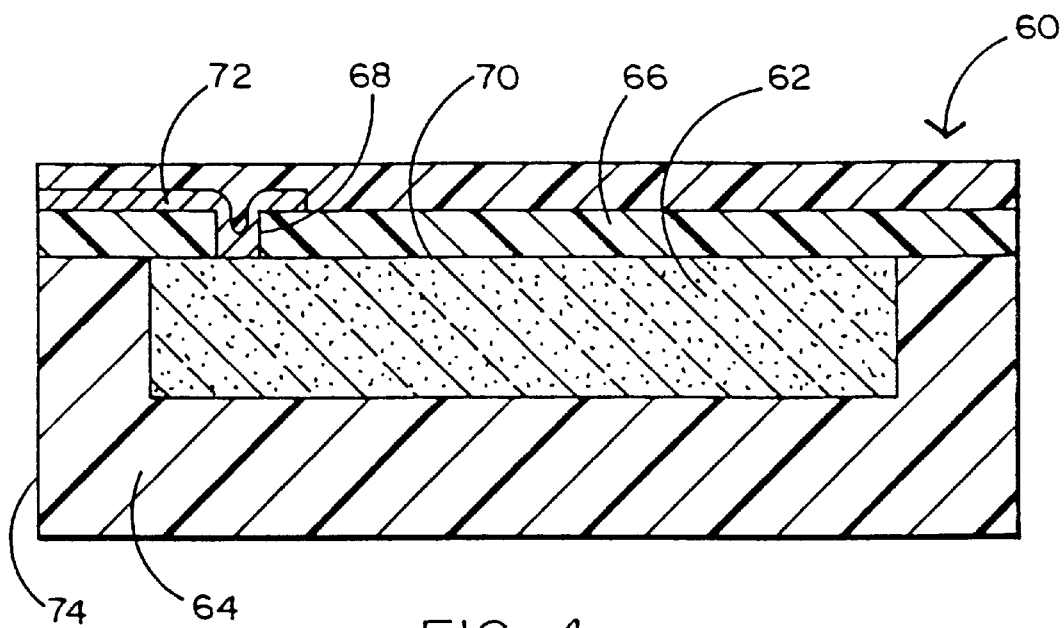
FIGS. 4a and 4b are cross-section views of an encapsulated neo-chip after dicing of a neo-wafer, with 4a showing an example in which the neo-wafer has been thinned.
Figure 4B:
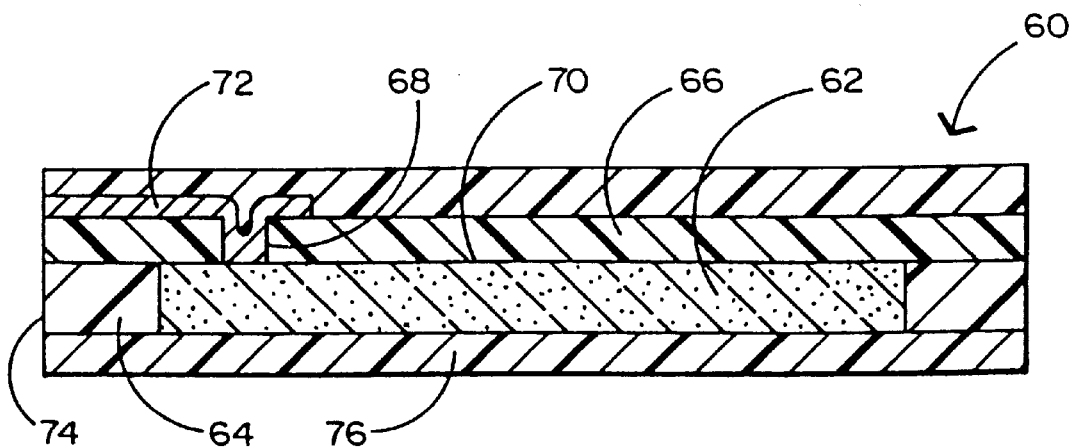

FIGS. 4a and 4b show in cross-section a neo-chip 60, after dicing of the neo-wafer. An IC chip, or die, 62 is embedded in the potting compound (epoxy) 64, which surrounds and supports the chip. A layer of dielectric material 66 extends over the top of neo-chip 60, except where the vias 68 have been formed leading to terminals on the active surface 70 of the chip 62. Metal leads 72 on top of dielectric layer 66 lead from the terminals to the access edge 74 of the neo-chip. The neo-chip, or layer, 60 is ready for stacking with other neo-chips having the same outer dimensions as those of neo-chip 60, but not necessarily containing an IC (semiconductor) chip having the same dimensions as chip 62.

FIG. 4a shows the general case, in which the epoxy 64 surrounds five of the six edges of the die. With a potting method using a clamping fixture as in FIG. 3, the thickness of epoxy on the bottom of the die will be minimal. Other fixturing methods could yield greater epoxy thickness. This could be desirable for structural, electrical, thermal or dimensional purposes. FIG. 4b shows the case in which the neo-wafer has been thinned after potting and modification, removing the potting compound 64 from the bottom surface. In this case it may be desirable to add an additional layer of passivation material 76 for structural support or electrical insulation.

Clearly it is desirable, for cost-saving reasons, to include multiple die in the neo-wafer, so that the passivation and metalization steps can be performed on all of the included die at the same time. The primary challenge in using a neo-wafer containing multiple die is the accurate location of each die. In a single die wafer, precise location is not required, because the neo-chip dimensions can be controlled by the dicing (sawing) process. With multiple die in the wafer, the accuracy necessary to locate each die prior to potting creates a potential alignment problem. Such accuracy is mandated both by the use of a re-routing mask to cover all of the die for a single metalizing operation, and by the eventual dicing of the wafer along lines which provide separately processed neo-die properly sized for stacking.

Figure 5:
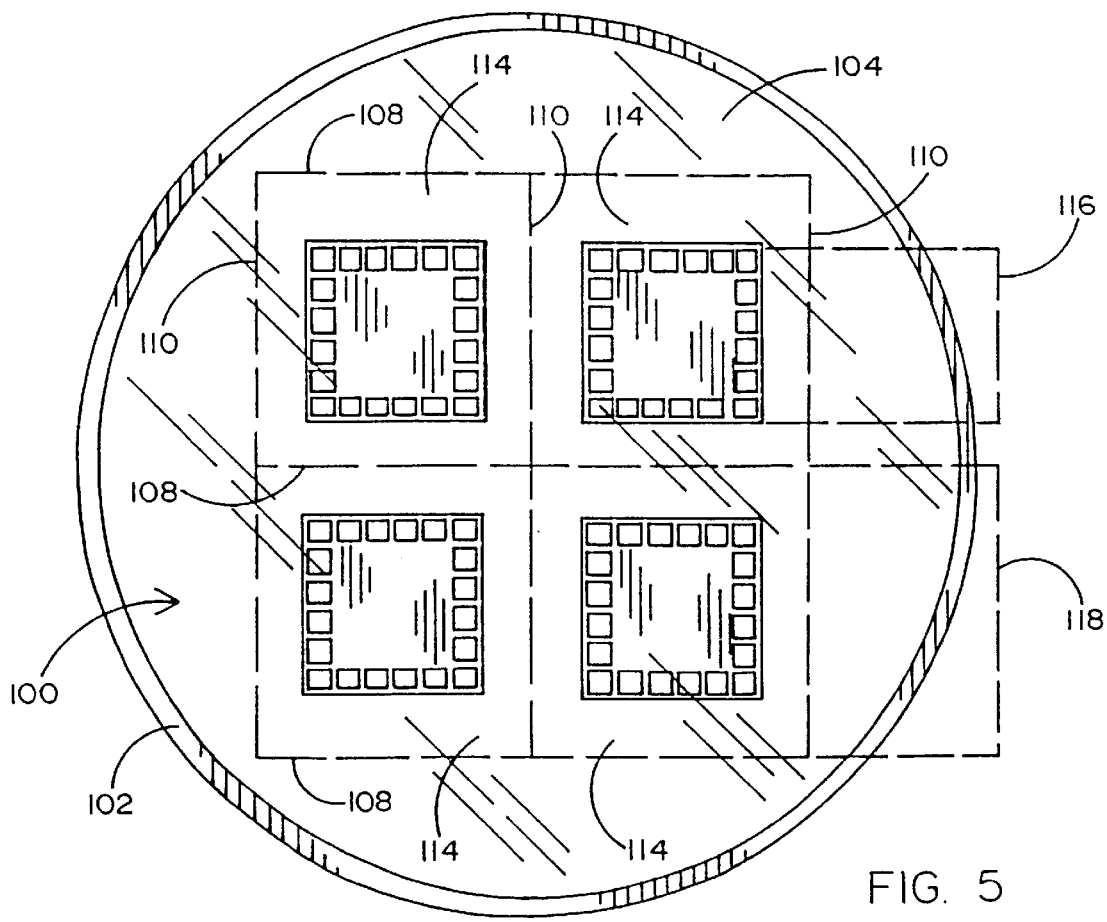
FIG. 5 is a plan view of a multiple die neo-wafer.
Figure 6:
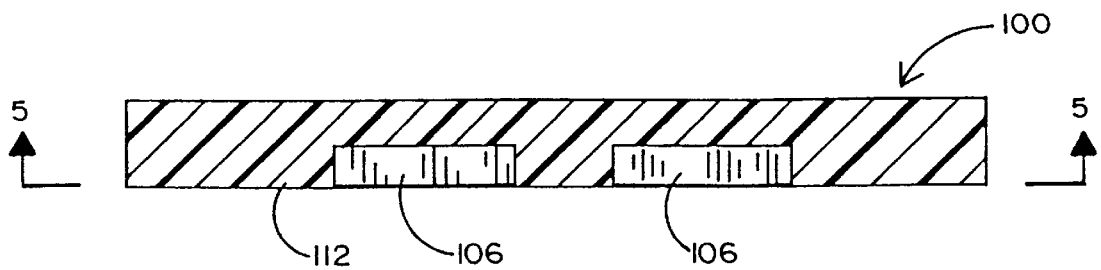
FIG. 6 shows a cross-section through the neo-wafer of FIG. 5.

FIGS. 5 and 6 show a multiple die neo-wafer 100. FIG. 5 is a plan view showing a ring dam 102, which retains encapsulating material (epoxy) 104, and a plurality (4) of precisely located "known good" die 106 embedded in the epoxy 104. The edges of the four neo-chips, each containing one die, which will be diced from the wafer, are indicated by horizontal lines 108 and vertical lines 100.

FIG. 6 is a cross-section through neo-wafer 100 after it has been removed from the ring dam. The neo-die 106 are shown at the bottom surface of the neo-wafer in FIG. 6. The neo-wafer is turned over for processing, so that the desired steps can be performed on surface 112 of the neo-wafer, where the "active" surfaces of the neo-die are located.

After the neo-wafer has been removed from the ring dam and the necessary passivating and metalizing processes have been performed on surface 112, the neo-wafer will be diced along lines 108 and 110 to form four neo-die, or neo-chips, 114. The dashed lines 116 and 118 at the right side of FIG. 5 compare the size of the original die 106 to the neo-die 114.

It is clear from FIGS. 5 and 6 that the plurality of "known good" die 106 embedded in neo-wafer 100 need not be the same size. As long as the four neo-chips 114, which are to be stacked, are the same size, the dicing process will be standard, even if the individual known good die 106 have different dimensions.

Figure 7:
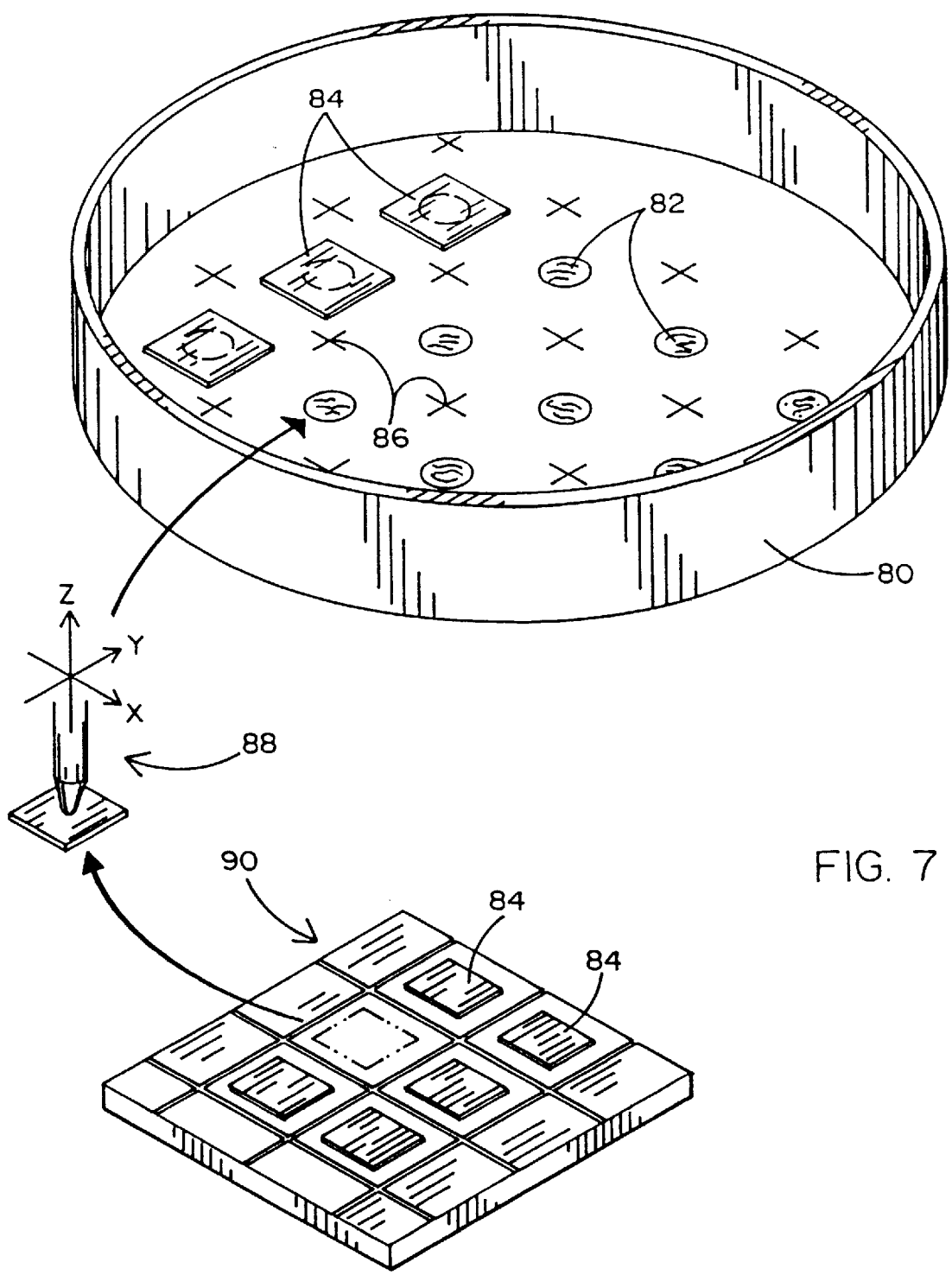
FIGS. 7–10 show steps in forming a neo-wafer containing multiple die.

FIGS. 7–10 show steps in forming a neo-wafer containing multiple die. In FIG. 7, the lower portion 80 of a potting fixture has a plurality of adhesive (epoxy) droplets 82 which secure in place a plurality of IC die 84, prior to the potting step. The die 84 need to be accurately located. Alignment marks 86 may be used for this purpose.

A pick-and-place machine 88 may be used to transfer individual "known good" IC die from a waffle pack 90 to their positions in the potting fixture. The die are placed upside down, i.e., their active surfaces contact the epoxy droplets.

Figure 8:
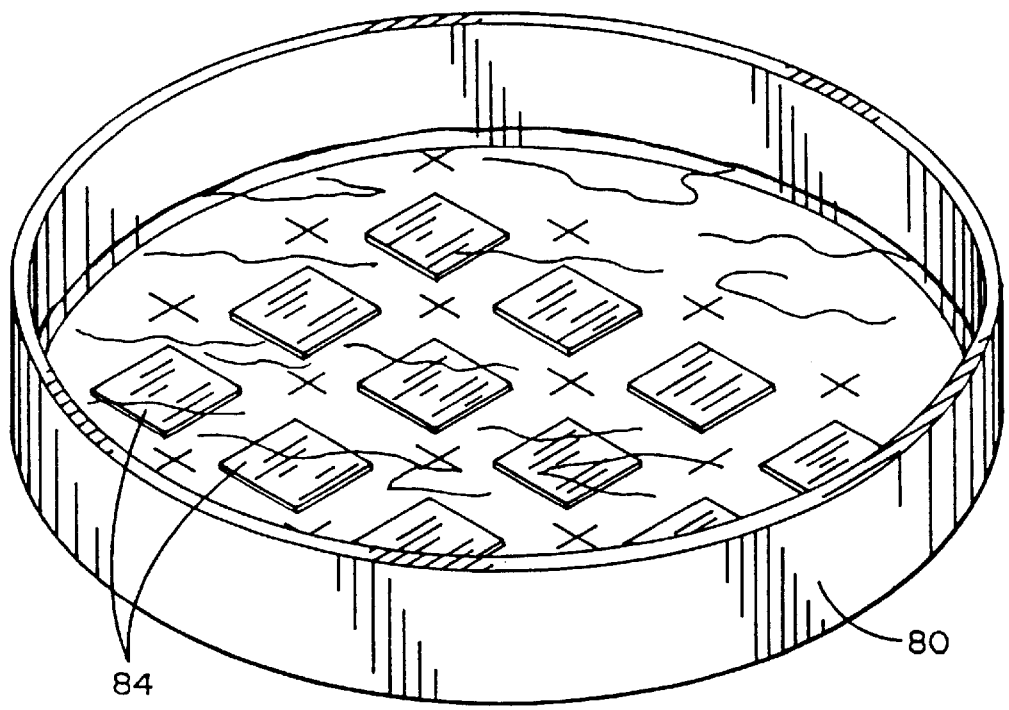
Figure 9:
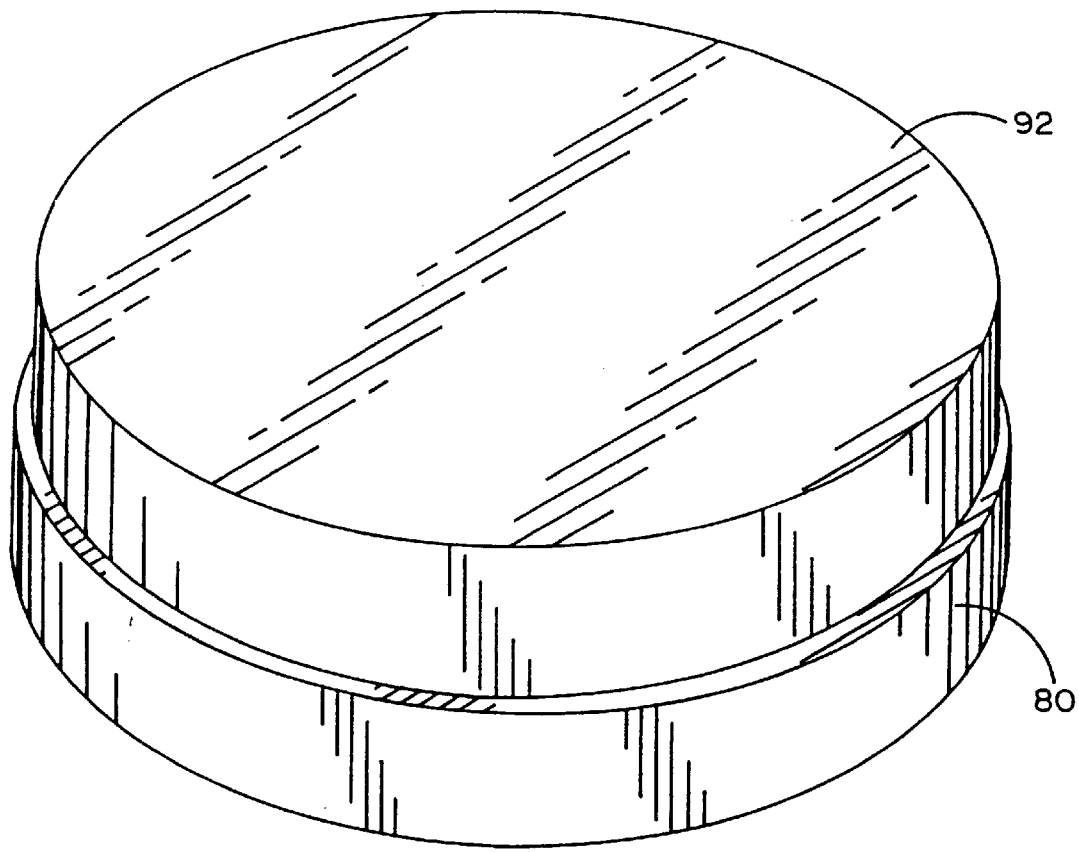
Figure 10:
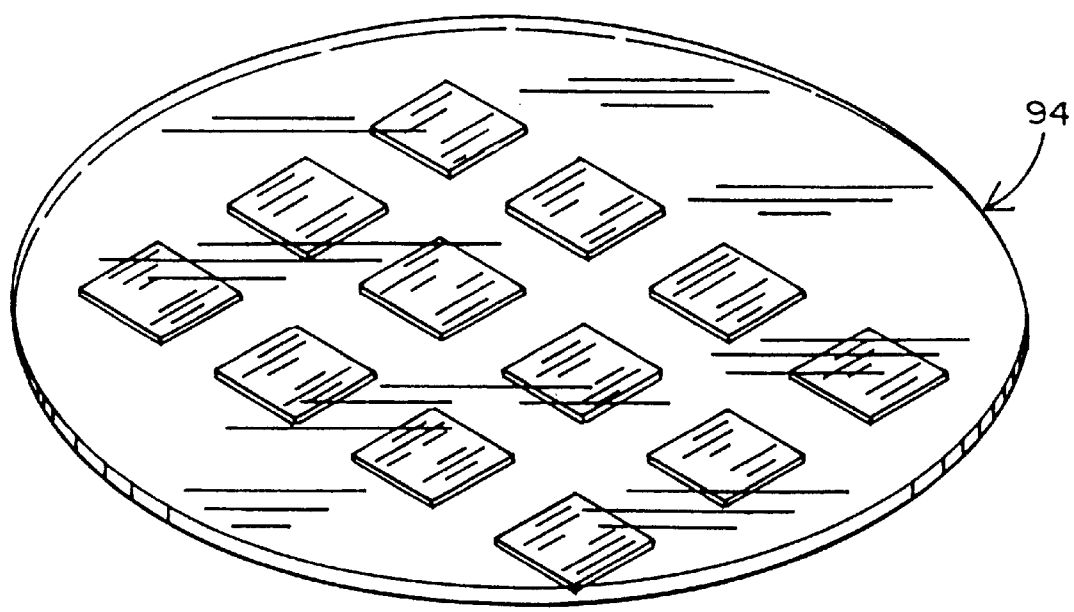

FIG. 8 shows the step of pouring the liquid potting compound (epoxy) into the lower part 80 of the fixture, covering the die 84. And in FIG. 9 the upper part 92 of the fixture is shown in place, squeezing excess air out of the chamber which contains the chips and epoxy. (Injection molding could be used in lieu of the method shown).

Next the epoxy is cured, usually by heating. After the epoxy has been cured, the potting fixture is opened, and the neo-wafer 94 is removed (see FIG. 10). The epoxy droplet material on the active surface of the neo-wafer needs to be removed, as by an acid etch.

The process steps outlined above are then performed on the neo-wafer surface, with the wafer held firmly in position, e.g., by a vacuum chuck. When all of the wafer level processing has been performed, the wafer is diced to provide neo-chips for stacking in the 3D format. Each neo-chip layer will have the area dimensions which can fit into a stack containing IC chips having different sizes and functions.

The chip stacking steps using the neo-chips may follow the same order previously developed, as disclosed in common assignee U.S. Pat. Nos. 4,525,921; 4,646,128; 5,104,820; and 5,279,991. However, the present process simplifies the previous processes by omitting the special steps heretofore necessary to prepare the access plane of the stack for metalization. In U.S. Pat. No. 4,525,921 an etch-back and dielectric deposition process is shown, and in pending application Ser. No. 08/622,671 a dielectric-deposition and trench-forming process is shown, each process used to cover the access plane with passivation and then expose leads from the stacked IC chips for connection to exterior circuits.

In the present process and structure, the potting compound (epoxy) is dielectric material which insulates the individual electrical leads at the access plane. A lapping of the access plane surface to insure exposure of the leads on the stacked layers is all that is required. In other words, each neo-chip provides its own insulation at the access plane, because the silicon semiconductor material is embedded in an epoxy having insulating properties.

Summarizing the advantages of the present invention over prior chip-stacking concepts, it has the following major benefits:

(1) The starting IC chips (die) intended for stacking can have different sizes, and serve different electronic purposes. After they are encapsulated in same-size neo-chips, they can be efficiently stacked using well-developed processing steps;

(2) The individual chips for stacking can be purchased as "known good" die. This means that an essentially unlimited choice of die is available to the stacking entity, and that the die are pretested when they are ready for stacking;

3. A given layer can contain a plurality of individual die; and

4. The die encapsulating material is dielectric, so that no special steps are required to prepare the access plane of the stack for metalization. Heretofore, this preparation has required either the etch-back plus passivation process, or the passivation plus trench-formation process.

From the foregoing description, it will be apparent that the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A three-dimensional stack of two or more neo-chip layers of equal total layer area, the stack comprising:

a first neo-chip layer having a first total layer area, the first neo-chip layer comprising a first die that is tested, the first die being embedded in a first dielectric material having a first encapsulating area, the first die having a first die area and containing a first circuitry for performing a first function, the first die area and the first encapsulating area combining to form the first total layer area; and a second neo-chip layer having a second total layer area equal to the first total layer area, the second neo-chip layer comprising a second die that is tested, the second die being embedded in a second dielectric material having a second encapsulating area different from the first encapsulating area, the second die having a second die area different from the first die area and containing a second circuitry for performing a second function different from the first function, the second die area and the second encapsulating area combining to form the second total layer area.

2. The stack of claim 1 wherein each die has an active surface, a bottom surface, and four side surfaces, wherein the active surface is adjacent to a top surface of each neo-chip layer.

3. The stack of claim 2 wherein the dielectric material encapsulates each die on the four side surfaces.

4. The stack of claim 3 wherein the dielectric material encapsulates each die on the bottom surface.

5. The stack of claim 3 further comprising a first passivation material covering the top surface of each neo-chip layer, the first passivation material encapsulating the active surface of each die, wherein the first passivation material is more compliant than the dielectric material.

6. The stack of claim 5 wherein the first passivation material comprises a polymer.

7. The stack of claim 7 wherein the polymer comprises Benzocyclobutene.

8. The stack of claim 5 wherein the first passivation material comprises a polyimide.

9. The stack of claim 5 wherein a via is defined in the first passivation material, the via reaching down to the active surface of each die.

10. The stack of claim 9 further comprising a metal lead disposed in the via.

11. The stack of claim 10 further comprising a second passivation material disposed on top of the first passivation material.

12. The stack of claim 3 further comprising a bottom passivation material disposed on a bottom surface of each neo-chip layer.

13. The stack of claim 1 wherein the first and second dielectric material comprise an epoxy material.

14. The stack of claim 13 wherein the epoxy material comprises Epotek 377.

15. The stack of claim 1 wherein the first and second die that are tested are burned in and known good.

16. The stack of claim 1 wherein the first neo-chip layer comprises a plurality of pre-tested dies.

17. A three-dimensional stack of two or more neo-chip layers of equal total layer area, the stack comprising:

a first initially discrete neo-chip layer comprising a first pre-diced and tested die and a first dielectric material encapsulating the first die; and a second initially discrete neo-chip layer comprising a second pre-diced and tested die and a second dielectric material encapsulating the second die, the second initially discrete neo-chip layer having a second total layer area equal to the first total layer area, wherein the first and second initially discrete neo-chip layers are coupled to form the three-dimensional stack.

18. The stack of claim 17:

wherein the first die has a first die area and contains a first circuitry for performing a first function, the first dielectric material having a first encapsulating area, the first die area and the first encapsulating area combining to form a first total layer area, wherein the second die has a second die area different from the first die area and contains a second circuitry for performing a second function different from the first function, the second dielectric material having a second encapsulating area different from the first encapsulating area, the second die area and the second encapsulating area combining to form the second total layer area, and wherein the second total layer area is equal to the first total layer area.

19. The stack of claim 13 wherein each die has an active surface, a bottom surface, and four side surfaces, wherein the active surface is adjacent to a top surface of each neo-chip layer.

20. The stack of claim 19 wherein the dielectric material encapsulates each die on the four side surfaces.

21. The stack of claim 20 wherein the dielectric material encapsulates each die on the bottom surface.

22. The stack of claim 20 further comprising a first passivation material covering the top surface of each neo-chip layer, the first passivation material encapsulating the active surface of each die, wherein the first passivation material is more compliant than the dielectric material.

23. The stack of claim 22 wherein the first passivation material comprises a polymer.

24. The stack of claim 23 wherein the polymer comprises Benzocyclobutene.

25. The stack of claim 22 wherein the first passivation material comprises a polyimide.

26. The stack of claim 22 wherein a via is defined in the first passivation material, the via reaching down to the active surface of each die.

27. The stack of claim 26 further comprising a metal lead disposed in the via.

28. The stack of claim 27 further comprising a second passivation material disposed on top of the first passivation material.

29. The stack of claim 20 further comprising a bottom passivation material disposed on a bottom surface of each neo-chip layer.

30. The stack of claim 17 wherein the first and second dielectric material comprise an epoxy material.

31. The stack of claim 30 wherein the epoxy material comprises Epotek 377.

32. The stack of claim 17 wherein the first and second die that are tested are burned in and known good.

33. The stack of claim 17 wherein the first neo-chip layer comprises a plurality pre-tested dies.

* * * * *

UNITED STATES PATENT AND TRADEMARK OFFICE
CERTIFICATE OF CORRECTION

| | | |
|---|---|---|
| PATENT NO. | : 6,072,234 | Page 1 of 1 |
| APPLICATION NO. | : 09/316740 | |
| DATED | : June 6, 2000 | |
| INVENTOR(S) | : Andrew N. Camien et al. | |

It is certified that error appears in the above-identified patent and that said Letters Patent is hereby corrected as shown below:

The following is added at Column 1, Line 7:

"Statement Regarding Federally Sponsored Research and Development

This invention was made with U.S. Government support under Contract No. NAS7-1374, awarded by the National Aeronautics and Space Administration. The U.S. Government has certain rights in the invention."

Signed and Sealed this

Thirty-first Day of March, 2009

JOHN DOLL
*Acting Director of the United States Patent and Trademark Office*